(12) United States Patent
Chen et al.

(10) Patent No.: US 9,490,712 B2
(45) Date of Patent: Nov. 8, 2016

(54) FLYBACK CONVERTER OUTPUT CURRENT EVALUATION CIRCUIT AND EVALUATION METHOD

(71) Applicant: Alpha and Omega Semiconductor (Cayman) Ltd., Sunnyvale, CA (US)

(72) Inventors: Yu-Ming Chen, Hsinchu (TW); Jung-Pei Cheng, Zhubei (TW); Pei-Lun Huang, Zhubei (TW)

(73) Assignee: Alpha and Omega Semiconductor (Cayman) Ltd., Sunnyvale, CA (US)

( * ) Notice: Subject to any disclaimer, the term of this patent is extended or adjusted under 35 U.S.C. 154(b) by 0 days.

(21) Appl. No.: 14/755,951

(22) Filed: Jun. 30, 2015

(65) Prior Publication Data

US 2016/0181929 A1 Jun. 23, 2016

(30) Foreign Application Priority Data

Dec. 17, 2014 (CN) .......................... 2014 1 0790883

(51) Int. Cl.
*H02M 3/335* (2006.01)
*G01R 19/10* (2006.01)
*G01R 19/15* (2006.01)

(52) U.S. Cl.
CPC .......... *H02M 3/33507* (2013.01); *G01R 19/10* (2013.01); *G01R 19/15* (2013.01)

(58) Field of Classification Search
CPC ...... H02M 1/36; H02M 3/325; H02M 3/335; H02M 3/33507; H02M 3/33538; H02M 2001/0009; H02M 2001/0038; G01R 19/10; G01R 19/15; G01R 19/16566; G01R 19/16533; G01R 19/16571; G01R 31/00

USPC ....... 363/21.12, 21.13, 21.18, 49, 50, 56.01, 363/95, 97
See application file for complete search history.

(56) References Cited

U.S. PATENT DOCUMENTS 6,137,702 A * 10/2000 Hall ...................... H02M 3/157
 323/272
6,862,194 B2 3/2005 Yang et al.
(Continued)

FOREIGN PATENT DOCUMENTS

CN 201450456 U 5/2010
CN 103986336 A 8/2014
(Continued)

*Primary Examiner* — Timothy J Dole
*Assistant Examiner* — Shahzeb K Ahmad

(57) ABSTRACT

An output current calculating circuit for a flyback converter operating under CCM and DCM is disclosed. The off current value $I_{ON}$ and the blanking current value $I_{LEB}$ flowing through a sensing resistor are calculated using a detection module and are summed together using a current summing unit. A voltage converted from the sum value of the off current value $I_{OFF}$ and the blanking current value $I_{LEB}$ is transmitted through an output stage in a predetermined time ratio of a cycle with the duty cycle determined by a logic control unit, in which the logic control unit controls the output stage to receive the voltage converted from sum current in a predetermined time period of each cycle, and prevents the output stage to receive the voltage converted from sum current in the remaining time other than such predetermined time period of each cycle.

20 Claims, 6 Drawing Sheets

(56) References Cited

U.S. PATENT DOCUMENTS

| | | |
|---|---|---|
| 6,940,320 B2 | 9/2005 | Sukup et al. |
| 7,265,999 B2 | 9/2007 | Murata et al. |
| 7,894,222 B2 * | 2/2011 | Djenguerian ........... H02M 1/32 363/21.12 |
| 8,089,781 B2 * | 1/2012 | Djenguerian ........... H02M 1/32 363/18 |
| 8,213,192 B2 | 7/2012 | Konecny et al. |
| 8,508,960 B2 | 8/2013 | Chen et al. |
| 8,780,590 B2 * | 7/2014 | So .................... H02M 3/33507 363/21.16 |
| 2004/0155639 A1 | 8/2004 | Mobers |
| 2009/0040796 A1 | 2/2009 | Lalithambika et al. |
| 2009/0141523 A1 | 6/2009 | Sugawara |
| 2011/0069420 A1 | 3/2011 | Chiu et al. |
| 2011/0216559 A1 | 9/2011 | Ng et al. |
| 2012/0274299 A1 | 11/2012 | Chang et al. |
| 2012/0281438 A1 * | 11/2012 | Fang ................. H02M 3/33515 363/21.12 |
| 2013/0057323 A1 | 3/2013 | Spini et al. |
| 2013/0223108 A1 | 8/2013 | Xu |
| 2015/0028790 A1 * | 1/2015 | Qu ........................... H02P 8/12 318/696 |
| 2016/0006358 A1 * | 1/2016 | Chen ................. H02M 3/33507 363/21.16 |

FOREIGN PATENT DOCUMENTS

| | | |
|---|---|---|
| CN | 203840204 U | 9/2014 |
| TW | I437238 B | 5/2014 |

* cited by examiner

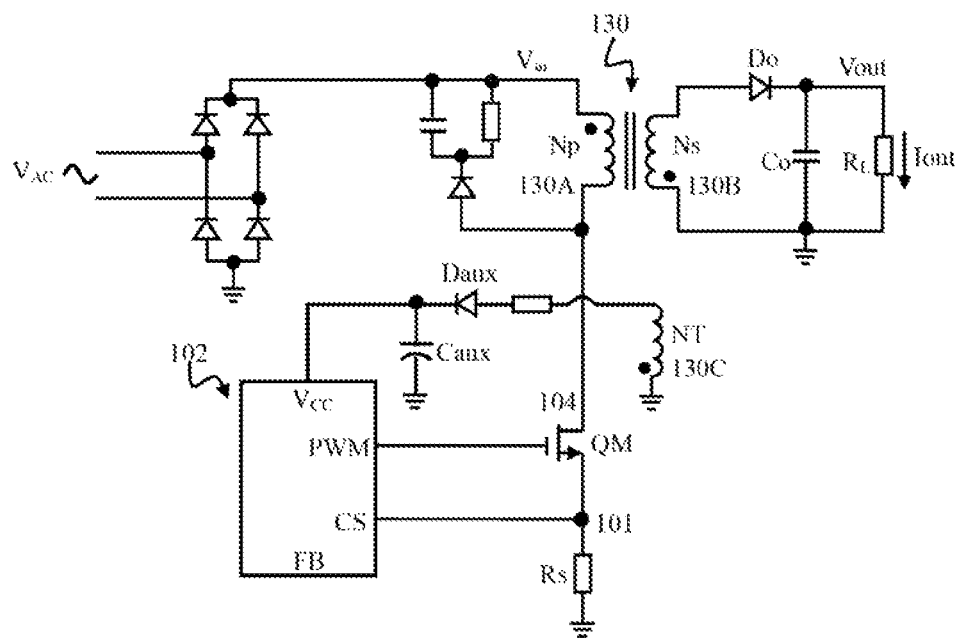
FIG. 1
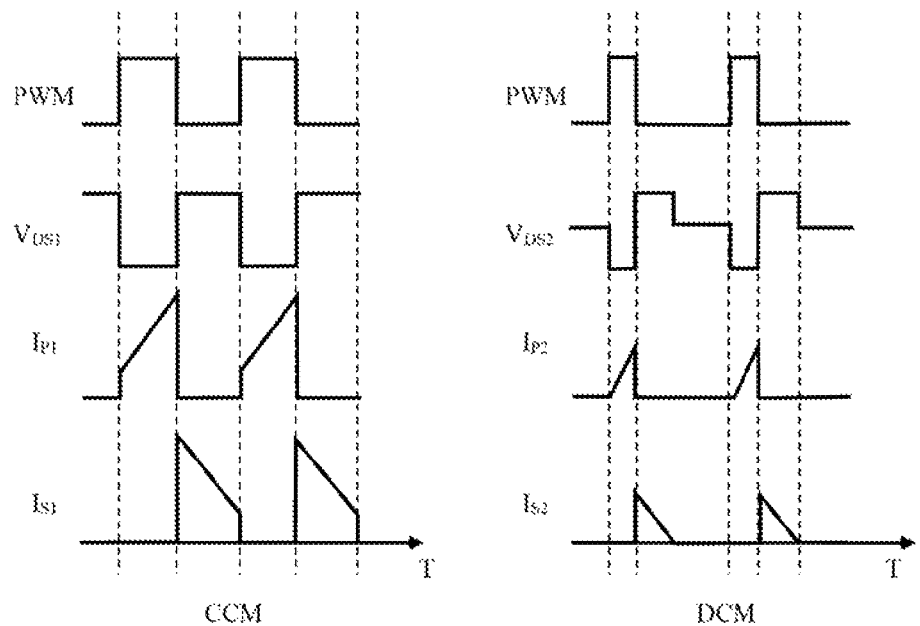
FIG. 2A
FIG. 2B

FLYBACK CONVERTER OUTPUT CURRENT EVALUATION CIRCUIT AND EVALUATION METHOD

CROSS-REFERENCE TO RELATED APPLICATIONS

This application claims the priority benefit of a Chinese patent application number 201410790883.0 filed Dec. 17, 2014 by a common inventor of this Application. The entire Disclosure made in the Chinese patent application number 201410790883.0 is hereby incorporated by reference.

FIELD OF THE INVENTION

The present invention relates to power conversion systems, specifically, relates to the device and method for detection and evaluation of output current of a flyback converter in a power supply to obtain an accurate evaluation of output current.

BACKGROUND OF RELATED ART

Conventional power conversion systems usually use power supply switching in constant voltage or constant current control mode. In a power conversion system, turning on or off of control switching elements on the primary winding of a transformer periodically generates currents on the winding passing through the switching elements, thus energy on the primary side is transmitted to the secondary side, and AC current generated on the secondary winding is rectified and filtered passing through diodes and capacitors and converted into DC voltage supplied to the loads.

However, there is a problem in accurate evaluation of output current supplied to the load, especially under conditions of continuous conduction mode (CCM) and discontinuous conduction mode (DCM).

It is within this context that embodiments of the present invention arise.

BRIEF DESCRIPTION OF THE DRAWINGS

The embodiments of this invention are described in more detail with reference to the accompanying drawings. However, the accompanying drawings are for the purpose of descriptions and illustrations only and do not impose limitation to the scope of the present invention:

FIG. 1 shows a simplified circuit diagram of a flyback converter of the present invention;

FIG. 2A shows waveforms of primary current and secondary current flowing through the primary winding and secondary winding controlled by the main switch driven by a control signal in CCM mode;

FIG. 2B shows waveforms of primary current and secondary current flowing through the primary winding and secondary winding controlled by the main switch driven by a control signal in DCM mode;

FIG. 3 shows waveform of the leading edge blanking signal LEB used to mask the initial spike of the leading edge of the sensing signal at the instance the main switch is turned on;

DETAILED DESCRIPTION OF THE SPECIFIC EMBODIMENTS

Figure 3:
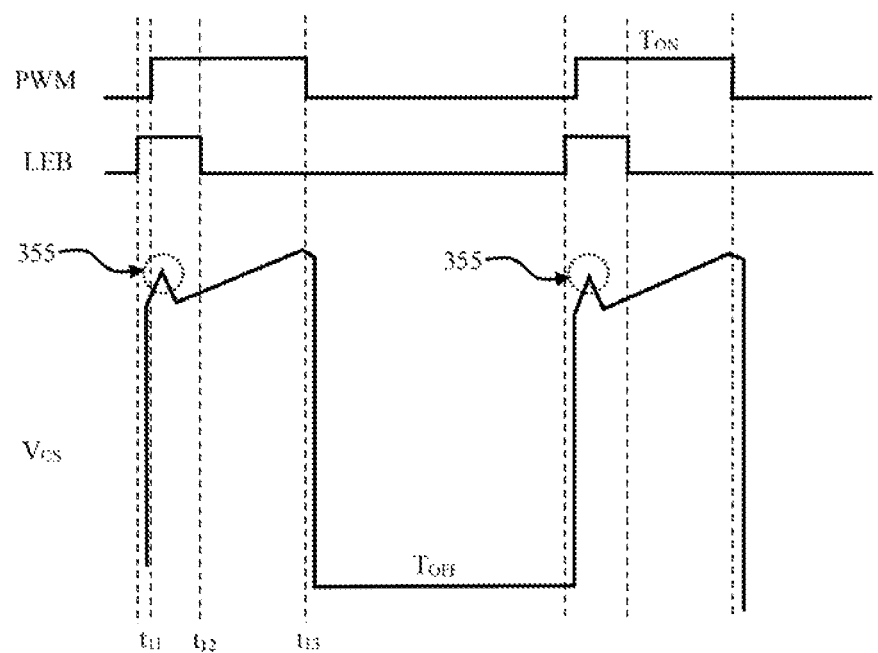

FIG. 1 shows a circuit configuration of a flyback converter according to an embodiment of the present invention. Main switch QM for control current flowing through primary side of transformer 130 may be a power MOSFET with a drain used as an input terminal, a source used as a output terminal and a gate used as a control terminal. The control terminal of the main switch QM receives a control signal produced by a main control module 102 and correspondingly turns on/off the main switch QM that controls current flowing through the primary winding 130A of transformer 130 in the flyback convertor to transfer energy from primary side to secondary side. The primary winding 130A receives a DC input voltage $V_{IN}$, which may be obtained by rectification of an AC voltage $V_{AC}$ via a bridge rectifier. Transformer 130 also has a secondary winding 130B for delivering an output voltage $V_{OUT}$, and an auxiliary winding 130C for detecting the state of voltage generated by the secondary winding 130B. The auxiliary winding 130C and the secondary winding 130B have the same polarity opposite to that of the primary winding 130A. One end of the auxiliary winding 130C is grounded and the other end is connected to the anode of a diode $D_{AUX}$, while the cathode of diode $D_{AUX}$ is connected to a capacitor $C_{AUX}$, so that after an AC voltage generated by the auxiliary winding 130C is rectified, it charges the capacitor $C_{AUX}$ to serve as an auxiliary power source. The voltage $V_{CC}$ stored in the capacitor $C_{AUX}$ is associated with and proportional to the output voltage $V_{OUT}$, and the voltage $V_{CC}$ can be an independent DC voltage source supplying to the control module 102. A diode $D_O$ and a rectifier-filter circuit capacitor $C_O$ are connected to the secondary winding 130B for generating the output voltage $V_{OUT}$ of the flyback converter. The DC output voltage $V_{OUT}$ is applied to a load $R_L$, thus resulting in an output current $I_{OUT}$ flowing through the load $R_L$. In the feedback loop of the converter, a sensing resistor $R_S$ is connected between the source terminal of the main switch QM and ground for detecting the primary current $I_P$ flowing through the primary winding 130A and providing a feedback voltage that equals the product of the resistance of sensing resistor $R_S$ and the current $I_P$ provided as a sensing signal $V_{CS}$ at node 101. The primary current $I_P$ can be used to characterize the secondary current $I_S$ flowing through the secondary winding 130B and the relationship between them will be described in detail later. The sensing port CS of the main control module 102 uses the sensing resistor $R_S$ to detect the magnitude of the primary current $I_P$ of the primary winding 130A, which is used as a basis to determine whether it is necessary to adjust the control signal to turn the main switch QM on or off. The topology and the operating modes of flyback converter are well known in the art, thus the circuitry and specific mode of operation will not be described here.

Referring to FIG. 2A, under CCM (Continuous Conduction Mode) the main switch QM is driven to turn on or off by a control signal such as pulse width modulated signal PWM and the like. FIG. 2A shows waveforms of the primary current $I_{P1}$ flowing through the primary winding 130A, the secondary current $I_{S1}$ flowing through the secondary winding 130B, and the differential voltage $V_{D1}$ between the drain and the source of the main switch QM. In an on-period $T_{ON}$ when the main switch QM is turned on, the primary current $I_{P1}$ has a step leading edge and increases linearly from the leading edge, and at an off-period $T_{OFF}$ when the main switch QM is off, the secondary current $I_{S1}$ is an attenuating triangular waveform. Thus in the following cycle at an instance when the main switch QM is about to turn on, there is still current remain in the secondary winding 130B, i.e. in the following cycle when the main switch QM turns on, the energy stored in the transformer 130 is not completely drained.

FIG. 2B shows waveforms of the primary current $I_{P2}$ flowing through the primary winding 130A, the secondary current $I_{S2}$ flowing through the secondary winding 130B, and the differential voltage $V_{DS2}$ between the drain and the source of the main switch QM when the converter is under DCM (Discontinuous Conduction Mode). Under DCM the primary current $I_{P2}$ does not have a step leading edge, and at the off-period $T_{OFF}$ when the main switch QM is off, the secondary current $I_{S2}$ is a direct attenuating triangle wave, which is attenuated to zero at the end of $T_{OFF}$ and before the following cycle begins, as such all the energy stored in the primary winding 130A when the main switch QM is turned on has been completely transferred from the secondary winding 130B to the load before the next cycle begins. A difference between the DCM and CCM is that within any cycle of the DCM the secondary current $I_{S2}$ will drop to zero when the control signal turns off the main switch QM, and between the moment the secondary current $I_{S2}$ is reduced to zero to the start of the following cycle (i.e. the moment the main switch QM turns on again) there exists a period of Dwell time $T_D$.

Referring to FIG. 3, a leading edge blanking signal LEB, which is well known in the art, is implemented to prevent unnecessary incorrect trigger during the detection of the primary current $I_P$. In the primary current control loop, initial pulse spike in the primary current $I_P$ often occurs at the instance the main switch QM is turned on. The initial spike is fed back to the main control module 102 at the sensing port CS. If the current flowing through the sensing resistor $R_S$, which is connected in series with the primary winding, at this moment is used to produce the sensing signal $V_{CS}$ to control the switch, then the unexpected initial spike 355 in the sensing signal $V_{CS}$ of FIG. 3 may cause a false trigger action, and further initiate over current protection mechanisms, as such the main control module 102, used to generate the control signals, will no longer send the pulse width modulation (PWM) signal, thus even though there is no actual abnormal over current condition, an action is triggered to erroneously turn off the main power switch QM to achieve the purpose of protecting the power switch and/or the entire flyback converter. A variable or fixed leading-edge blanking signal LEB generated by a conventional leading edge blanking circuit is used to eliminate such risks of false trigger, and the signal is coupled to the control terminal of the main switch QM to ensure that the main switch is not erroneously turned off during the period when the leading edge blanking signal LEB is at high level and to sample the current signal in the sensing resistor $R_S$ after the end of the leading edge blanking signal LEB to capture the actual and precise initial value of the sensing signal $V_{CS}$, thus shielding of the initial pulse spike of the primary current $I_P$ at the instance the primary switch QM is turned on.

It is well known in the art that the leading edge blanking circuit is used for filtering the initial spike of the primary current $I_P$ at the instance when the main switch QM is turned on, and the leading edge blanking signal can be changed to a high level at or slightly before the instance the control signal turns on the main switch QM, whereby the primary inductive voltage spikes generated at node 101 on the ungrounded end of the sensing resistor $R_S$ in FIG. 1 are filtered out. The design of leading edge blanking circuit is well known in the art, and for more detailed description, any conventional power management design manual, or U.S. Pat. Nos. 8,278,830 and 8,300,431 and other literature can be referred to.

Figures 4A, 4B:
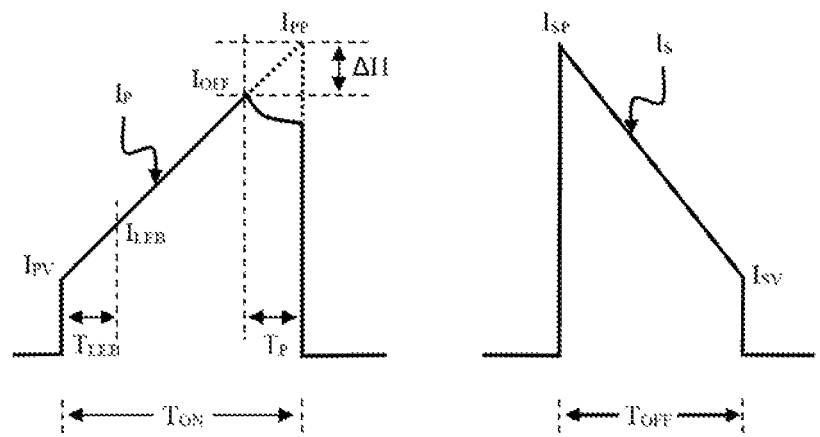
FIGS. 4A-4C show stepped current waveforms of primary current and secondary current in CCM mode.
Figure 4C:
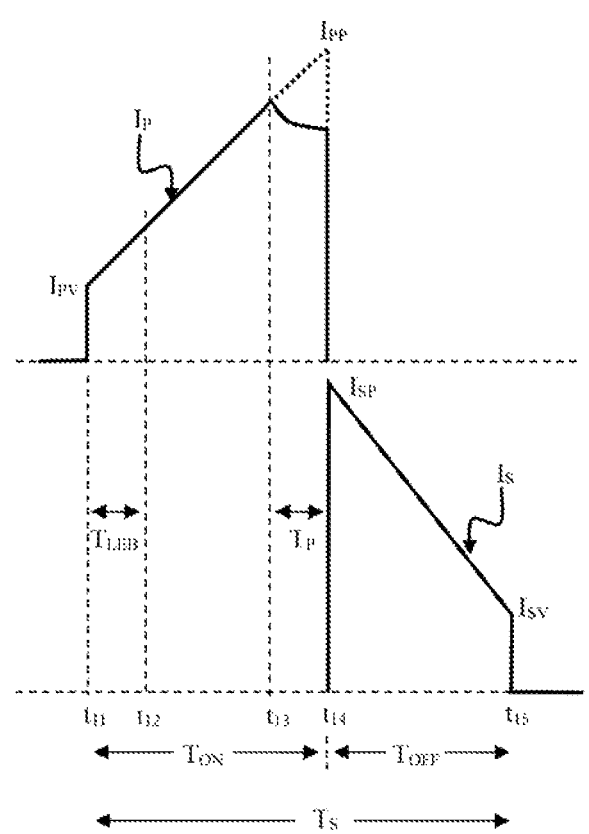

Referring to FIGS. 4A-4C, when the flyback converter enters CCM, at time $t_{11}$ at the start of a cycle, the control signal drives the main switch QM to turn on. Since there is still energy maintained in the transformer 130 from the previous cycle, at instance when the main switch QM turns on the primary current $I_P$ rapidly increases from zero to an initial leading edge value $I_{PV}$, which is a step leading edge with a value greater than zero. In a period from $t_{11}$ to $t_{13}$ of the same cycle, since the control signal continues to drive the main switch QM to be on, the primary current $I_P$ continues to increase at a linear rate from the initial leading edge value $I_{PV}$. It is important to note that at time $t_{13}$, the logic high level of the control signal is removed and there is a tendency to turn off the main switch QM, however the primary current $I_P$ does not drop immediately, but during a propagation delay time $T_P$ from time $t_{13}$ to $t_{14}$, the primary current $I_P$ continue to increase at the same rate as the period from time $t_{11}$ to $t_{13}$ until it reaches the highest peak current $I_{PP}$, and when the delay time $T_P$ ends at time $t_{14}$ the primary current $I_P$ drops quickly from the peak $I_{PP}$ to zero. As shown in FIGS. 4B-4C, in the period from $t_{14}$ to $t_{15}$, the control signal drives the main switch QM to turn off completely, and at time $t_{14}$ the primary winding 130A of transformer 130 starts to transfer the energy stored to the secondary winding 130B, thus the secondary current $I_S$ flowing through the secondary winding 130B at time $t_{14}$ will rapidly increases from zero to a maximum peak current $I_{SP}$ with the polarities of all the windings turned opposite, thereby the flyback voltage of the secondary winding 130B causes the rectifier diode $D_O$ in FIG. 1 to be forward bias, providing the load current and at the same time charging the output capacitor $C_O$. In the period from $t_{14}$ to $t_{15}$ the secondary current $I_S$ gradually decreases at a constant rate. The cycle ends at time $t_{15}$, the main switch QM is turned on again in the following cycle, but this time the secondary current $I_S$ has an end state trailing edge value $I_{SV}$, which is an end state step value greater than zero. In the following cycle immediately after time $T_{15}$ the main switch QM will be turned on again resulting in the secondary current $I_S$ dropping from the end state trailing edge value $I_{SV}$ to zero. For CCM operation, the period from $t_{11}$ to $t_{15}$ can be viewed as a complete cycle $T_S$, in which the period from $t_{11}$ to $t_{14}$ is defined as the on-period $T_{ON}$ during which the main switch QM is turned on, the period from $t_{14}$ to $t_{15}$ is defined as the off-period $T_{OFF}$ during which the main switch QM is off, as such the duty cycle $D_{B1}$ of the main switch should be $T_{ON}$ divided by the sum of the on-period and the off-period, i.e., $D_{B1}=T_{ON}/(T_{ON}+T_{OFF})$.

Setting the number of turns of the primary winding 130A to be $N_P$ and that of the secondary winding 130B to be $N_S$ and the ratio between them to be N (i.e., $N=N_P/N_S$), the peak of the secondary current $I_S$ is $I_{SP}=N\times I_{PP}$, the end-state trailing edge value of the secondary current $I_S$ is $I_{SV}=N\times I_{PV}$. In CCM of the flyback converter, the output current $I_O$ supplied to the load $R_L$ satisfies the following relationship:

$$I_O = \frac{I_{SP}+I_{SV}}{2} \times \frac{T_{OFF}}{T_S} \tag{1}$$

-continued $$I_O = \frac{N \times (I_{PP} + I_{PV})}{2} \times (1 - D_{B1}) \quad (2)$$

Referring to FIG. 4A and FIG. 4C, at time $t_{13}$, the control signal is intentionally changed from high level to low level, so that the main switch QM is turned off, causing the primary current IP having an off-current value $I_{OFF}$, which is a transient value, at the moment of change of the control signal. As mentioned above, in the propagation delay time period $T_P$ from $t_{13}$ to $t_{14}$, the off-current value $I_{OFF}$ is not the maximum value of the primary current $I_P$, even though at time $t_{13}$ the logic state of the control signal has changed and tend to turn off the main switch QM, the primary current $I_P$ will not drop immediately, but instead in the period from $t_{13}$ to $t_{14}$, the primary current $I_P$ will continue to rise from the off-current value $I_{OFF}$, at the same rate of increment from the initial leading edge value $I_{PV}$ to the off-current value $I_{OFF}$, to the final maximum value of the peak current $I_{PP}$, as shown by the dotted vertices in FIG. 4A and FIG. 4C. At time $t_{14}$, which is the end of the propagation delay time $T_P$, the main switch QM is turned off, and the off-period $T_{OFF}$ begins, thus the primary current $I_P$ drops rapidly from the maximum value of the peak current $I_{PP}$ to zero.

Referring to FIG. 3, FIG. 4A and FIG. 4C, at time $t_{12}$ when the leading edge blanking signal LEB changes from high level to low level and ends its active state, a transient intermediate current value of the primary current $I_P$ is sampled and recorded as the blanking current value $I_{LEB}$, and the rate of increment when the primary current $I_P$ rises from the initial leading edge values $I_{PV}$ (leading edge step value) to the blanking current value $I_{LEB}$ is exactly the same as that of the primary current $I_P$ rises from the off-current value $I_{OFF}$ to the peak current $I_{PP}$. In a complete cycle, the time period from time $t_{11}$ when the control signal drives the main switch QM to turn on to the time $t_{12}$ when the high level state of the blanking signal LEB ends is defined as $T_{LEB}$ that equals to delay time $T_P$, which is the period from time $t_{13}$ when the control signal drives to turn off the main switch QM to time $t_{14}$ when the primary current $I_P$ reaches the peak $I_{PP}$ (i.e., $T_{LEB}=T_P$). In addition, as shown in FIG. 4A, the current difference between the peak current $I_{PP}$ and the off-current $I_{OFF}$ is defined as $\Delta I1$. As such, the relationship of the currents is calculated from the geometric perspective of FIG. 4A as $I_{PP}=I_{OFF}+\Delta I1$ and $I_{PV}=I_{LEB}-\Delta I1$, then:

$$I_{PP}+I_{PV}=(I_{OFF}+\Delta I1)+(I_{LEB}-\Delta I1) \quad (3)$$

$$I_{PP}+I_{PV}=I_{OFF}+I_{LEB} \quad (4)$$

Substituting equation (4) into equation (2), the output current $I_O$ under CCM can be expressed as:

$$I_O = \frac{N \times (I_{OFF} + I_{LEB})}{2} \times \frac{T_{OFF}}{T_S} \quad (5)$$

where $T_S = T_{ON} + T_{OFF}$

Neither $I_{PP}$ nor $I_{SV}$ is included in the expression of the secondary side output current $I_O$ shown in equation (5). Because the degree of overshoot and the overshoot peak value are difficult to detect and measure by the circuit in reality, thus it is almost impossible to rely on $I_{PP}$ or $I_{SV}$ for the calculation of the output current $I_O$ and equation (5) is a good solution to this problem in CCM.

Figures 5A, 5B:
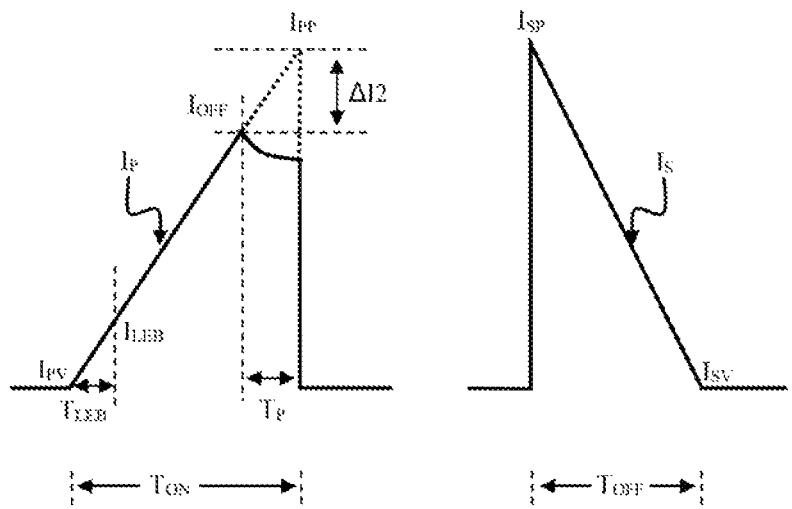
FIGS. 5A-5C show triangular current waveforms of primary current and secondary current in DCM mode.
Figure 5C:
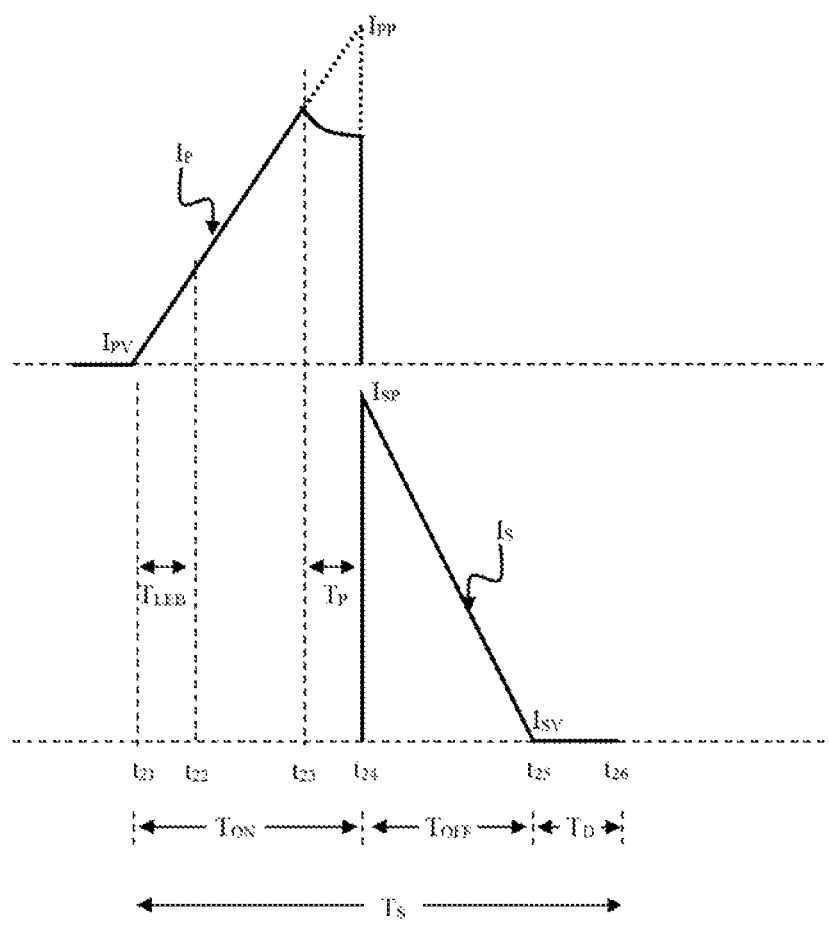

Referring to FIGS. 5A-5C, when the flyback converter enters DCM, at time $t_{21}$ when a cycle starts, the control signal drives the main switch QM to turn on. Since there is no energy remained in the transformer 130 from the previous cycle, the initial leading edge value $I_{PV}$ of the primary current $I_P$ at the moment the main switch QM is turned on is almost zero, which is completely different from CCM when it has an initial step value. In a period from $t_{21}$ to $t_{23}$, the control signal continues driving the main switch QM turning on, so during this period the primary current $I_P$ gradually rises at a constant rate from the initial leading edge $I_{PV}$ having a value of zero. At time $t_{23}$, the control signals changes from a logical high level to a low level thus turning off the main switch QM, and similarly as mentioned above in the CCM the primary current $I_P$ does not fall immediately, and instead in the propagation delay time $T_P$ from time $t_{23}$ to $t_{24}$, the primary current $I_P$ rises to the peak current $I_{PP}$ at the same rate of the period from $t_{21}$ to $t_{23}$, until the delay time $T_P$ ends at time $t_{24}$ when the primary current $I_P$ drops quickly from the peak $I_{PP}$ to zero.

Referring to FIGS. 5B-5C, after the end of the delay time $T_P$, in the period from $t_{24}$ to $t_{25}$, the control signal drives the main switch QM to turn off completely, and at time $t_{24}$ the primary winding 130A of transformer 130 starts to transfer the stored energy to the secondary winding 130B, hence the secondary current $I_S$ flowing through the secondary winding 130B will jump from zero to a peak current $I_{SP}$ with maximum value at time $t_{24}$, where the polarities of the similarly marked ends and differently marked end of the windings of the transformer 130 turn opposite, thus the flyback voltage of the secondary winding 130B causes the rectifying diode $D_O$ of FIG. 1 being forward bias to provide current to the load while charging the output capacitor $C_O$, then in the period from $t_{24}$ to $t_{25}$ the secondary current $I_S$ gradually decreases to zero at a constant rate. Another difference between DCM and CCM operations is that at time $t_{25}$ when the cycle has not ended, the secondary current $I_S$ has an end trailing edge value $I_{SV}$ of zero, in other words, the secondary current $I_S$ has decreased to zero at the end of the off-period $T_{OFF}$ before the start of the following cycle, and all the energy stored in the primary winding 130A during the on-period when the main switch QM is turned on has been completely transferred from the secondary winding 130B to the load before the following cycle begins. In FIG. 5C, the secondary current $I_S$ will drop to zero at the end of the off-period $T_{OFF}$ when the control signal turns off the main switch. A period of dwell time $T_D$ exists between times $t_{25}$ when the secondary current $I_S$ drops to zero to time $t_{26}$ when the cycle ends. The following cycle begins after time $t_{26}$, so the dwell time $T_D$ is between the time $t_{25}$ when the secondary current $I_S$ drops to zero and the time $t_{26}$ when the main switch QM is turned on again in the following cycle. Specifically for a flyback converter in DCM, the time frame from time $t_{21}$ to $t_{26}$ is viewed as a complete cycle $T_S$ including the period from time $t_{21}$ to $t_{24}$ defined as the on-period $T_{ON}$ during which the main switch QM is turned on, the period from $t_{24}$ to $t_{25}$ defined as the off-period $T_{OFF}$ during which the main switch QM is turned off, and the period from time $t_{25}$ to $t_{26}$ defined as the dwell time $T_D$ during which the main switching QM is also turned off, hence the duty cycle $D_{B2}$ of the primary side should be $T_{ON}$ divided by the sum of the on-period, the off-period and the dwell time $(T_{ON}+T_{OFF}+T_D)$, or $D_{B2}=T_{ON}/(T_{ON}+T_{OFF}+T_D)$.

Setting the number of turns of the primary winding 130A to be $N_P$, the number of turns of the secondary winding 130B to be $N_S$ and the ratio of the two to be N (i.e., $N=N_P/N_S$), the peak current $I_{SP}$ of the secondary winding current $I_S$ is $I_{SP}=N \times I_{PP}$, and the end trailing edge value $I_{SV}$ of the secondary winding current $I_S$ is 0. Under DCM of flyback converter, the output current $I_O$ provided to the load $R_L$ satisfies the following functions:

$$I_O = \frac{I_{SP} + I_{SV}}{2} \times \frac{T_{OFF}}{T_S} \qquad (6)$$

$$I_O = \frac{N \times (I_{PP} + I_{PV})}{2} \times \frac{T_{OFF}}{T_S} \qquad (7)$$

Referring to FIG. 5A and FIG. 5C, at $t_{23}$ when the control signal changes from logic high level to logic low level, the control signal drives the main switch QM to turn off, simultaneously causing the primary current $I_P$ to have an off current value $I_{OFF}$ at the moment the control signal changing its logical state. In the propagation delay time $T_P$ from time $t_{23}$ to time $t_{24}$, the off-current $I_{OFF}$ is the maximum value $I_{PP}$ of the primary current $I_P$, and even at time $t_{23}$ when the logical state of the control signal tends to turn off the main switch QM, the primary current $I_P$ does not drop immediately. In fact, from time $t_{23}$ to $t_{24}$, the primary current $I_P$ will continue to rise from the off-current $I_{OFF}$, at the rate same it rises from the initial leading edge value $I_{PV}$ to off-current $I_{OFF}$, until current $I_P$ reaching a final maximum value of the peak current $I_{PP}$, as shown by the vertex in dotted line of FIG. 5A. As the delay time $T_P$ ends and the off-period $T_{OFF}$ begins at time $t_{24}$, the main switch QM is completely turned off, the primary current $I_P$ begins to decrease rapidly from the peak current $I_{PP}$ to zero.

Referring to FIG. 5C, at time $t_{22}$ when the leading edge blanking signal LEB changes from high level to low level and ends its active state, a transient intermediate current value of the primary current $I_P$ is sampled and recorded as the blanking current value $I_{LEB}$, where the rate of increment when the primary current $I_P$ rises from the initial leading edge values $I_{PV}$ (zero value) to the blanking current value $I_{LEB}$ is exactly the same as that when the primary current $I_P$ rises from the off-current value $I_{ON}$ to the peak current $I_{PP}$. In a complete cycle, the period from time $t_{21}$ when the control signal drives the main switch QM to turn on to the time $t_{22}$ when the high level state of the blanking signal LEB ends is defined as $T_{LEB}$ that equals to delay time $T_P$, which is the period from time $t_{23}$ when the control signal drives to turn off the main switch QM to time $t_{24}$ when the primary current IP rises to the peak $I_{PP}$ (i.e., $T_{LEB}=T_P$), and also the difference between the peak current $I_{PP}$ and the off-current $I_{OFF}$ is defined as $\Delta I2$. The relationship of the currents is calculated from the geometric perspective of FIG. 5A resulting in $I_{PP}=I_{OFF}+\Delta I2$ and $I_{PV}=I_{LEB}-\Delta I2=0$.

$$I_{PP}+I_{PV}=(I_{OFF}+\Delta I2)+(I_{LEB}-\Delta I2) \qquad (8)$$

$$I_{PP}+I_{PV}=I_{OFF}+I_{LEB} \qquad (9)$$

Substituting equation (9) into equation (7), under DCM the output current $I_O$ can be expressed as:

$$I_O = \frac{N \times (I_{OFF} + I_{LEB})}{2} \times \frac{T_{OFF}}{T_S} \qquad (10)$$

in which $T_S = T_{ON} + T_{OFF} + T_D$

The degree of overshoot of the primary peak current $I_{PP}$ or secondary end trailing edge current $I_{SV}$ is difficult to capture or detect, however the equation (10) provides a good solution to this problem in DCM, because the formula of the output current $I_O$ does not include neither $I_{PP}$ nor $I_{SV}$.

As described above, the calculation of the output current $I_O$ under CCM requires the blanking current value $I_{LEB}$ at time $t_{12}$ and the off-current value $I_{OFF}$ at time $t_{13}$, and under DCM requires blanking current value $I_{LEB}$ at time $t_{22}$ and the off-current $I_{OFF}$ at time $t_{23}$. Unlike $I_{PP}$ or $I_{PV}$ whose real values are difficult to measure, the blanking current value $I_{LEB}$ and the off-current value $I_{OFF}$ can be directly captured at the appropriate moment at node 101 at the ungrounded end of the sensing resistor $R_S$, thus the output current $I_O$ in equations (5) and (10) can be calculated.

Figure 6:
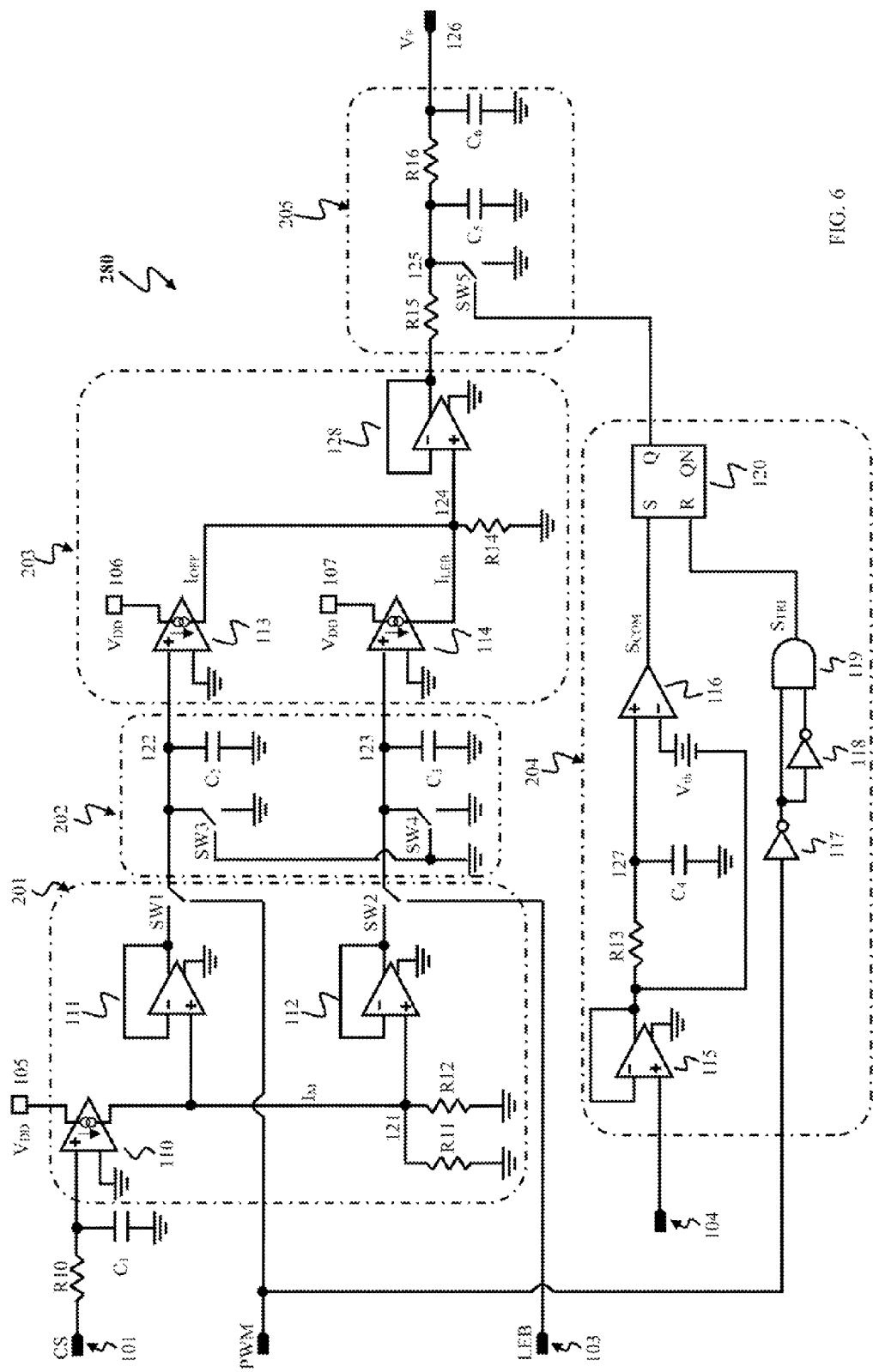
FIG. 6 illustrates a flyback converter output current evaluation circuit of the present invention.

FIG. 6 illustrates a calculation circuit 280 for calculating the output current $I_O$ of the secondary winding 130B of the flyback converter, in other words, to achieve the equations (5) and (10). The calculation circuit 280 includes a detection module 201 for detecting and capturing the primary current $I_P$ flowing through the primary winding 130A, which can be the direct detection of the sensing voltage $V_{CS}$ across the sensing resistor $R_S$ since the sensing voltage $V_{CS}$ is the product of the resistance of the sensing resistor $R_S$ and the primary current $I_P$ flowing through the sensing resistor $R_S$ at a certain moment. Detection module 201 is also used to selectively detect the precise values of the blanking current $I_{LEB}$ and the off-current $I_{OFF}$ at the appropriate moment.

As shown in FIG. 6, in the detection module 201, a DC power supply voltage $V_{DD}$ is applied at node 105 providing the operating voltage for the voltage-current converter 110 having the input terminal connected to the common node 101 of the flyback converter circuit in FIG. 1, and as mentioned above the sensing resistor $R_S$ and the main switch QM are also connected to node 101. The voltage-current converter 110 is referred to as the first voltage-current converter. A conversion resistor R12 is connected between the output terminal of the voltage-current converter 110 and the ground, so that the voltage-current converter 110 will convert the sensing voltage $V_{CS}$ sent to its input terminal to an intermediate current $I_M$ which flows through the conversion resistor R12 producing a voltage at node 121 at the ungrounded end of the conversion resistor R12. As an optional, a resistor R10 can be connected between the input terminal of the voltage-current converter 110 and the common node 101, and a capacitor $C_1$ is connected between the input terminal of the voltage-current converter 110 and the ground, thus providing a smoother sensing signal $V_{CS}$ sent to the input terminal of the voltage-current converter 110. As an option, a regulating resistor R11 with variable resistance can be connected between node 121 and the ground, as such the regulating resistor R11 and the conversion resistor R12 of the detection module 201 are connected in parallel between the node 121 and the ground, hence the total resistance between node 121 and the ground becomes adjustable through the regulating resistor R11.

As shown in FIG. 6, the detection module 201 also includes a first voltage follower 111 and a second voltage follower 112. The positive input terminals of the first and the second voltage followers 111, 112 are connected to node 121 at the ungrounded end of the conversion resistor R12, while the negative input terminal of the first voltage follower 111 is connected to its output and the negative input of the second voltage follower 112 is connected to its output. Each of the first and second voltage followers 111 and 112, which are basically the same, generates a voltage corresponding to the respective input voltage applied at their positive input terminal. Each of the first and second voltage follower 111, 112 is used as an input buffer that has a high input impedance characteristic for connecting with the signal source, since a high input impedance can isolate the level of influence between input and output, and also has a low output impedance characteristic for reducing the capture time of the sensing signal $V_{CS}$. First and second voltage follower 111, 112 are operational amplifiers configured as voltage followers or unity gain buffer. In addition, as mentioned above, the sensing signal $V_{CS}$ needs to be captured in an appropriate time, therefore the detection module 201 further includes a switch SW1 referred to as a first switch and a switch SW2 referred to as a second switch. Switch SW1 is connected between the output of voltage follower 111 and the sample and hold latch 202, and the switch SW2 is connected between the output of the second voltage follower 112 and the sample and hold latch 202. All the switches in the calculation circuit 208, for example switches SW1 and SW2 and the other, are three-port electronic switches, each of which includes an input terminal, an output terminal, and a control terminal. For example, these electronic switches can be a P-type or N-type MOS transistor, a bipolar transistor, a junction transistor, or a combination thereof.

Under CCM operation, the detection module 201 detects the sensing signals $V_{CS-LEB}$ at node 101 at the ungrounded end of the sensing resistor $R_S$ at time $t_{12}$ in FIG. 4C. In addition to shielding the initial spike 355 of the sensing signal $V_{CS}$ in FIG. 3, the leading edge blanking signal LEB is also connected to node 103 at the control terminal of the switch SW2. As long as the leading edge blanking LEB has a logic high level, the switch SW2 is always turned on, and the characterization of the primary current $I_P$ is reflected as the sensing signal $V_{CS}$ at node 101. In any cycle, in the period $T_{LEB}$ starting from time $t_{11}$ when the main switch QM is turned on to time $t_{12}$ when the leading edge blanking signal LEB changes from high level to low level, when the leading edge blanking signal LEB is in the high level, the primary current $I_P$ increases from an initial leading edge value of $I_{PV}$ at time $t_{11}$ to the blanking current value $I_{LEB}$ at time $t_{12}$, thus the changes of the sensing signal $V_{CS}$ at node 101 is detected by detection module 201, where the voltage-current converter 110 reconverts the current that is converted from the sensing voltage signal $V_{CS}$ to a voltage applied at node 121 at the ungrounded end of the conversion resistor R12.

Specifically, within the period $T_{LEB}$ the dynamic sensing signal $V_{CS}$ is transmitted to the voltage-current converter 110, but when the leading edge blanking signal LEB changes from high level to the low level and the switch SW2 is turned off, thus after the time $t_{12}$ to the following cycle before the leading edge blanking signal changes from low level to high level, the second voltage follower 112 is unable to convert the voltage at node 121 to current. At time $t_{12}$ the corresponding sensing signal $V_{CS-LEB}$ with the blanking current value $I_{LEB}$ is inputted to the input terminal of the voltage-current converter 110 and is converted to an intermediate current $I_M$ that flows through the conversion resistor R12, whereby the intermediate current $I_M$ is further converted to the voltage across the resistor R12, for example equals to the voltage sensing signal $V_{CS-LEB}$, and the second voltage follower 112 then converts the voltage applied to the conversion resistor R12, i.e., the voltage on node 121, to a voltage that equals to voltage sensing signal $V_{CS-LEB}$ and transmits the output voltage. After leading edge blanking signal LEB changes from the high level to the low level, within a cycle $T_S$ the final output voltage of the second voltage follower 112 is set at the level of voltage sensing signal $V_{CS-LEB}$ corresponding to time $t_{12}$. The voltage generated from the second voltage follower 112 is transmitted to a second storage capacitor $C_3$ of the sample and hold latch (S/H) 202 of the calculation circuit 280 and thus the capacitor C3 is charged, and the switch SW2 is connected between node 123 at one end of the second storage capacitor $C_3$ and the output terminal of the second voltage follower 112, while the other end of the second storage capacitor $C_3$ is connected to the ground. As such, the voltage, which is equivalent to the voltage sensing signal $V_{CS-LEB}$, charges the second storage capacitor $C_3$, thus the second storage capacitor $C_3$ maintains and stores the information of the corresponding blanking current value $I_{LEB}$ flowing through the primary winding 130A at time $t_{12}$, and the stored information is considered as the voltage $V_{CS-LEB}$ at node 123 at one end of the second storage capacitor $C_3$.

Still under CCM operation, the detection module 201 also detects the voltage detection signals $V_{CS-OFF}$ at node 101 at one end of the sensing resistor RS corresponding to time $t_{13}$ in FIG. 4C. In addition to driving the control terminal of the main switch QM, the control signal such as PWM also drives the control terminal of the switch SW1. When the control signal has a high logical state, the switch SW1 is turned on, otherwise the switch SW1 is turned off, and along with the gradual increase of the primary current $I_P$, the characteristic of the primary current $I_P$ is fully reflected by the sensing signal $V_{CS}$ at node 101. In any cycle, in the period from time $t_{11}$ when the main switch QM is turned on to time $t_{13}$ when the control signal changes from high level to low level, the primary current $I_P$ increases from an initial leading edge value $I_{PV}$ to an off-current value $I_{OFF}$ at time $t_{13}$, thus the corresponding changes of the sensing signal $V_{CS}$ is detected by the detection module 201 at node 101, and the voltage-current converter 110 reconverts the current converted from the sensing signal $V_{CS}$ to a voltage value at node 121 at the ungrounded end of the conversion resistor R12.

More specifically, in the period from $t_{11}$ to $t_{13}$, the dynamic sensing signal $V_{CS}$ is sent to the voltage-current converter 110, and when the control signal changes from the high level to the low level at time $t_{13}$ turning off the switch SW1, from time $t_{13}$ till the following cycle before the control signal changes from low level to high level, the first voltage follower 111 cannot convert the voltage at node 121 to current. At time $t_{13}$ the corresponding sensing signal $V_{CS-OFF}$ characterizing the off-current value $I_{OFF}$ is fed to the input terminal of the voltage-current converter 110 and is converted to an intermediate current $I_M$ flowing through the conversion resistor R12, whereby the intermediate current $I_M$ is further converted to the voltage drop across the resistor R12, for example equals to the voltage sensing signal $V_{CS-OFF}$, and the first voltage follower 111 then converts the voltage across the conversion resistor R12, i.e., the voltage on node 121, to a voltage that equals to sensing signal $V_{CS-OFF}$ and then transmits the output voltage. Within a cycle $T_S$ the final output voltage of the first voltage follower 111 is set at the level of sensing signal $V_{CS-OFF}$ corresponding to time $t_{13}$. The voltage outputted from the first voltage follower 111 is sent to a first storage capacitor $C_2$ of the sample and hold latch (S/H) 202, and the switch SW1 controlled by the control signal is connected between node 122 at one end of the first storage capacitor $C_2$ and the output terminal of the first voltage follower 111, while the other end of the first storage capacitor $C_2$ is connected directly to the ground. The voltage that is equivalent to the sensing signal $V_{CS-LEB}$ charges the first storage capacitor $C_2$, thus the first storage capacitor $C_2$ stores the information of the corresponding off-current value $I_{OFF}$ flowing through the primary winding 130A at time $t_{13}$, where the stored information is considered as the voltage $V_{CS-OFF}$ at node 122 at the ungrounded end of the first storage capacitor $C_2$. Optionally, the sample and hold latch 202 includes a switch SW3 connected in parallel with the first storage capacitor $C_2$ between node 122 and the ground and a switch SW4 connected in parallel with the second storage capacitor $C_3$ between node 123 and the ground, where the switches SW3 and SW4 are normally turned off but can be turned on by the drive signal applied on their control terminal when the discharge of the first and second storage capacitors C2 and C3 is necessary to reset the operation.

The same method of the voltage converter for detecting the blanking current value $I_{LEB}$ and off-current value $I_{OFF}$ as describe above under CCM operation is also applied for detecting the blanking current value $I_{LEB}$ and off-current value $I_{OFF}$ under DCM. Under DCM operation, the detection module 201 is also used for detecting the sensing signals $V_{CS-LEB}$ at node 101 at one end of the sensing resistor RS at time $t_{22}$ in FIG. 5C. The leading edge blanking signal LEB is connected to node 103 on the control terminal of the switch SW2, and when the leading edge blanking signal LEB has a high logical state, the switch SW2 is turned on. In the period from time $t_{21}$ when the main switch QM is turned on to time $t_{22}$ when the leading edge blanking signal LEB changes from the high level to the low level, i.e. within period $T_{LEB}$, the primary current $I_P$ rises from the initial leading edge value $I_{PV}$ of zero to blanking current value $I_{LEB}$ at time $t_{22}$. Although in the period $T_{LEB}$ the dynamic sensing signal $V_{CS}$ is continuously transmitted to the voltage-current converter 110, but when the leading edge blanking signal LEB changes from the high level to the low level, the switch SW2 is turned off, and between time $t_{22}$ to the following cycle before the leading edge blanking signal LEB changes from low level to high level, the second voltage follower 112 cannot convert the voltage at node 121. At time $t_{22}$ the sensing signal $V_{CS-LEB}$ characterizing the blanking current value $I_{LEB}$ is fed to the input terminal of voltage-current converter 110 and is converted into an intermediate current $I_M$ flowing through the conversion resistor R12, then further converted to the voltage across the conversion resistor R12. The second voltage follower 112 then converts the voltage across the conversion resistor R12, i.e., the voltage on node 121, into a voltage equivalent to the sensing signal $V_{CS-LEB}$ and then sends out the output voltage. Within a cycle $T_S$ the final output voltage of the second voltage follower 112 is equivalent to the sensing signal $V_{CS-LEB}$ corresponding to time $t_{22}$, which is then applied to the storage capacitor $C_3$ to charge the capacitor $C_3$, thus the second storage capacitor $C_3$ stores the information of the corresponding blanking current value $I_{LEB}$ that flows through the primary winding 130A at time $t_{22}$, where the stored information is considered as the voltage $V_{CS-LEB}$ at node 123 at the ungrounded of the second storage capacitor $C_3$.

Under DCM operation, the detection module 201 also detects the sensing signals $V_{CS-OFF}$ at node 101 at one end of the sensing resistor RS at time $t_{23}$ in FIG. 5C. The control signal is transmitted to the control terminal of the switch SW1, and when the control signal has a high logical state, the switch SW1 is turned on. In a period from time $t_{21}$ when the main switch QM is turned on to time $t_{23}$ when the control signal changes from the high level to the low level, the primary current $I_P$ rises from the initial leading edge value $I_{PV}$ of zero to the off-current value $I_{OFF}$ at time $t_{23}$. In the period from $t_{21}$ to $t_{23}$, the dynamic sensing signal $V_{CS}$ is continually transmitted to the voltage-current converter 110, but when the control signal changes from the high level to the low level turning off the switch SW1, and between time $t_{23}$ to the following cycle before the control signal changes from low level to high level, the first voltage follower 111 cannot convert the voltage at node 121. At time $t_{23}$ the corresponding sensing signal $V_{CS-OFF}$ characterizing the off-current value $I_{OFF}$ is fed to the input terminal of voltage-current converter 110 and is converted into an intermediate current $I_M$ flowing through the conversion resistor R12, and thus further converted to the voltage across the conversion resistor R12. The first voltage follower 111 then converts the voltage across the conversion resistor R12, i.e., the voltage on node 121, into a voltage equivalent to the sensing signal $V_{CS-OFF}$ and transmits the output voltage. Within a cycle $T_S$ the final output voltage of the first voltage follower 111 is equivalent to the sensing signal $V_{CS-OFF}$ corresponding to time $t_{23}$, which is applied to the first storage capacitor C2 to charge the capacitor $C_2$, thus the first storage capacitor $C_2$ stores the information of the corresponding off-current value $I_{OFF}$ that flows through the primary winding 130A at time $t_{23}$, and the stored information is considered as the voltage $V_{CS-OFF}$ at node 122 at the ungrounded of the second storage capacitor $C_2$.

According to the method described above, the detection module 201 captures the blanking current $I_{LEB}$ at time $t_{12}$ and off-current $I_{OFF}$ at time $t_{13}$ under CCM and stored them in the sample and hold latch 202, and captures the blanking current $I_{LEB}$ at time $t_{22}$ and off-current $I_{OFF}$ at time $t_{23}$ under DCM and stored them in the sample and hold latch 202. The ultimate goal is the calculation $I_O$ from the equations (5) and (10), hence the calculation of the sum of blanking current value $I_{LEB}$ and off-current $I_{OFF}$ and the calculation of the ratio of $T_{OFF}$ to $T_S$ are further described below.

Referring to FIG. 6, the calculation circuit 280 includes a current summing unit 203 that includes two voltage-current converters 113, 114 referred to as second and third voltage-current converters respectively. A DC power supply voltage $V_{DD}$ supplies the operating voltage to the voltage-current converter 113 and 114 at node 106 and 107 respectively. The output terminals of both voltage converters 113 and 114 are connected at node 124, and a summing resistor R14 is connected between node 124 and the ground. The input terminal of voltage-current converter 113 is connected to the node 122 at one end of the first storage capacitor $C_2$. The first storage capacitor $C_2$ supplies the off-current value $I_{OFF}$, which is equivalent to the voltage value $V_{CS-OFF}$, to the voltage-current converter 113 for converting this off-current value $I_{OFF}$ into an output current equal to the off-current $I_{OFF}$. Meanwhile, the input terminal of voltage-current converter 114 is connected to the node 123 at one end of the second storage capacitor $C_3$, so the second storage capacitor $C_3$ transmits the blanking current value $I_{LEB}$, which is equivalent to the voltage value $V_{CS-LEB}$, to the voltage-current converter 114 for converting this blanking-current value $I_{LEB}$ into an output current equal to the blanking-current $I_{LEB}$.

In other words, based on the fact that the output terminals of voltage-current converter 113 and 114 are both connected to the common node 124 at the ungrounded end of the summing resistor R14, and the other end of the summing resistor R14 is connected to the ground, hence the current flowing through the summing resistor R14 is equal to the sum of the off-current $I_{OFF}$ and blanking current $I_{LEB}$ (i.e., $I_{LEB}+I_{OFF}$), and the voltage $V_{124}$ at node 124 is equal to the product of the sum $(I_{LEB}+I_{OFF})$ and the resistance $R_{SUM}$ of the summing resistor R14. Further, the current summing unit 203 further includes a third voltage follower 128 having the positive input terminal connected to the common node 124 at one end of resistor R14 and the negative input terminal connected to its output, which is configured as a voltage follower or a unity gain amplifier. As the third voltage follower 128 receives a voltage at its positive input terminal, it generates and transmits out the voltage $V_{TRS}$ that can be regulated by adjusting the resistance of the summing resistor R14, because the output voltage $V_{TRS}$ is equal to the product of the sum $(I_{LEB}+I_{OFF})$ and the resistance $R_{SUM}$ of the summing resistor. In an optional but non-limiting embodiment, if the resistance of summing resistor R14 is equal to 1 ohm, then the output voltage $V_{TRS}$ of the third voltage follower 128 may be equal to the sum $(I_{LEB}+I_{OFF})$.

Referring to FIG. 6, the calculation circuit 280 also includes an output stage 205 for sending out the final voltage $V_F$ at node 126. If the output voltage $V_{TRS}$ of the third voltage follower 128 is only transmitted through the output stage 205 within the off-period $T_{OFF}$ in a cycle $T_S$, then the output voltage can be $V_F=V_{TRS}\times(T_{OFF}\div T_S)$, as such $V_F=R_{SUM}\times(I_{LEB}+I_{OFF})\times(T_{OFF}\div T_S)$, which depends on the specific calculation method of the calculation circuit. Referring to equations (5) and (10) above, if the turns ratio N is set by the transformer 130 and is adjustable, hence the relationship between the output current $I_O$ of the secondary side of transformer 130 and the output voltage $V_F$ of the output stage 205 is $I_O=(N\times V_F)\div(R_{SUM}\times 2)$, i.e., the output current $I_O$ of the flyback converter can be calculated through the output stage 205.

Referring to FIG. 6, the calculation circuit 280 further includes a logic control unit 204, which controls that the output voltage $V_{TRS}$ of the third voltage follower 128 is only sent to output stage 205 within the off-period $T_{OFF}$ in a cycle $T_S$. The output stage 205 also includes a switch SW5, referred to as a third switch, having the output terminal connected to the ground and the input terminal coupled directly or indirectly to the output of the third voltage follower 128 at the node 125. In one embodiment, the output stage 205 also includes a resistor R15 connected between the output terminal of the third voltage follower 128 and node 125 at the input terminal of switch SW5 and a capacitor $C_5$ connected between node 125 at one end of the switch SW5 and ground. The resistor R15 and capacitor $C_5$ are configured to be equivalent to a sample and hold circuit. In a complete cycle $T_S$, either under CCM or DCM, the switch SW5 is turned off within the off-period $T_{OFF}$ so that the output voltage $V_{TRS}$ can go through the output stage 205 and transmitted at node 126. However, during the on-period $T_{ON}$ under CCM or during the on-period $T_{ON}$ and the dwell time $T_D$ under DCM the switch SW5 needs to be turned on, so that the output voltage $V_{TRS}$ flows to the ground via switch SW5 and will not be transmitted to node 126. Therefore the control unit 204 is used to determine the timing to turn the switch SW5 on or off, so that the calculation using the output voltage $V_{TRS}$ transmitted by the third voltage follower 128 multiplying a ratio $(T_{OFF}\div T_S)$ can be implemented.

Referring to FIG. 6, the logic control unit 204 includes a fourth voltage follower 115 having the positive input terminal connected to node 104 of the main switch QM, i.e., at the drain terminal of the N-type power MOSFET in FIG. 1, where the source terminal of the main switch QM is connected to node 101. The fourth voltage follower 115 acts as an input buffer having a high input impedance for connection with the signal source and isolating the influence of the input and output from each other, with the negative input terminal connected to its output terminal making it an operational amplifier configured as a voltage follower or a unity gain buffer. The fourth voltage follower 115 is for the detection of the voltage changes at the common node 104 where the drain terminal of the main switch QM and the primary winding 130A are connected to. Alternatively other adjustable voltage amplifiers and similar devices can be replaced the fourth voltage follower 115 in FIG. 6, as such the voltage at the drain terminal of the main switch QM can firstly be decreased or increased before being transferred to one end of the resistor R13. In logic control unit 204, the fourth voltage follower 115 receives a drain voltage at its positive terminal, generates an output voltage, and transfers the output voltage to one end of a resistor R13, while the other end of resistor R13 is connected to node 127 at one end of a capacitor $C_4$ and the other end of the capacitor $C_4$ is connected to the ground. Resistor R13 and capacitor $C_4$ form a phase shifting circuit reflected when the voltage at the output terminal of the fourth voltage follower 115 drops at node 127 after a short time delay, therefore they are also equivalent to a delay circuit. In addition, logic control unit 204 also includes a comparator 116 having the non-inverting input terminal connected to the node 127 and the inverting input terminal connected to a positive electrode of a voltage source (such as a battery) that provides a reference voltage $V_{TH}$, and the negative electrode of the battery is connected to the output terminal of the fourth voltage follower 115. The fourth voltage follower 115 monitors the changing trend of voltage at node 104 at the drain of the main switch QM, and the initial voltage at node 104 is converted to the form of secondary voltage by the fourth voltage follower 115. The comparator 116 compares the voltage of the capacitor C4 at node 127 received at the non-inverting input terminal with the sum of the reference voltage $V_{TH}$ and the output voltage from the fourth voltage follower 115 received at the inverting input terminal, and then transmits the comparison result to the set terminal S of an RS flip-flop 120 in the logic control unit 204.

Figure 7A:
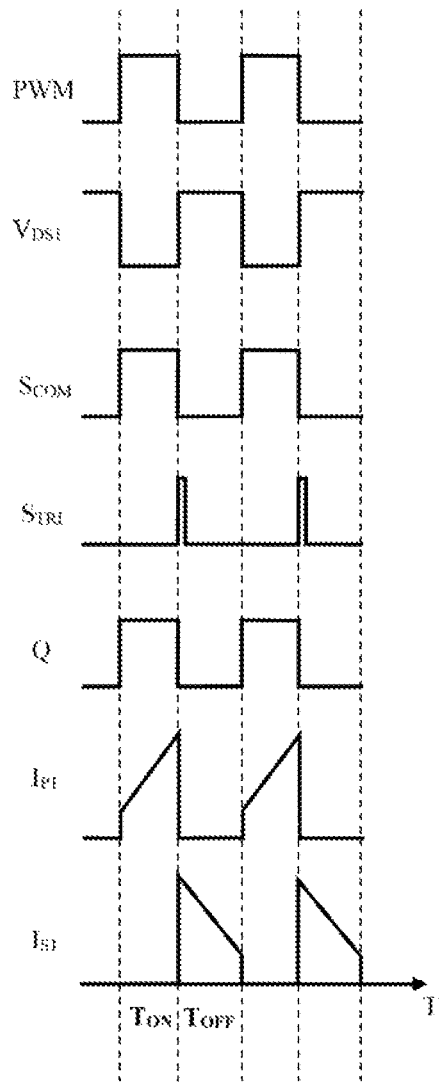
FIGS. 7A-7B show output waveforms of signals at the input and output terminals of a RS flip-flop in a flyback converter output current evaluation circuit in FIG. 6 in CCM and DCM modes.
Figure 7B:
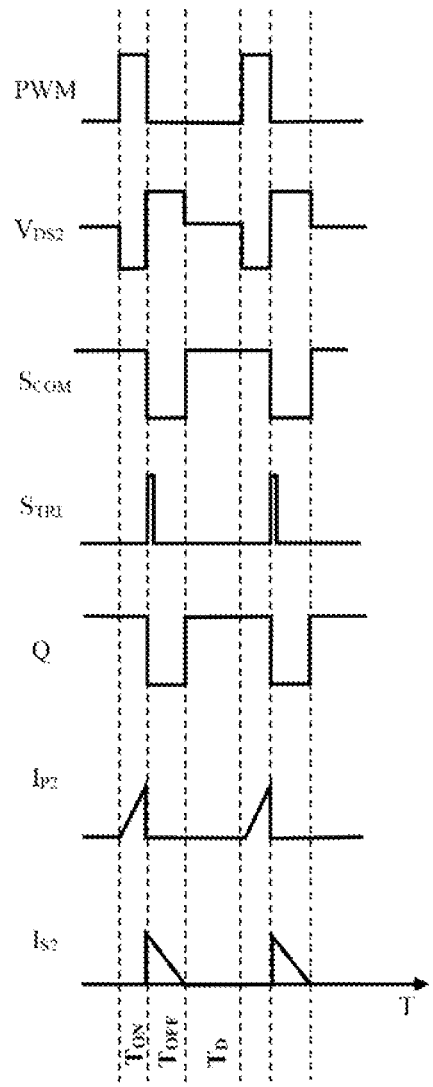

The control signal such as a PWM signal generated by the main control module 102 drives the gate of the main switch QM and the control terminal of switch SW1 and also controls the logic control unit 204. The logic control unit 204 also includes two inverters 117, 118 and an AND gate 119, where the inverter 118 is connected between the two input terminals of the AND gate 119. The control signal passes through only the inverter 117 and is fed to an input terminal of AND gate 119, and the control signal also passes through inverter 117 and inverter 118, i.e., being inverted twice, and then is fed to the other input terminal of the AND gate 119. Inverter 118 has a delay time of nanoseconds (ns) level, hence AND gate 119, inverter 118 and the inverter 117 form a monostable multivibrator triggered by the falling edge of the control signal. The output terminal of AND gate 119 is connected to the reset terminal R of RS flip-flop 120, as such the output signal at of the output terminal Q of the RS flip-flop 120 is mainly controlled by the output signal $S_{TRI}$ from the AND gate 119 and the comparison result $S_{COM}$ from the comparator 116, where the comparison result $S_{COM}$ of comparator 116 depends on drain voltage of the main switch QM and the output signal $S_{TRI}$ of the AND gate 119 depends on the falling edge of the control signal. The output terminal Q of RS flip-flop 120 is connected to the control terminal of switch SW5 in the output stage 205, therefore the output signal at the output terminal Q drives the switch SW5 to turn it on or off. FIG. 7A and FIG. 7B show that the output waveform Q is influenced by the output signal $S_{TRI}$ from the AND gate 119 and the comparison result $S_{COM}$ from the comparator 116 under CCM and DCM respectively.

Referring to FIGS. 7A and 7B, whether under CCM or DCM, the AND gate 119 generates a high level monostable reset signal of a nanosecond (ns) level because of the inverted control signals PWM at the end of each on-period of the main switch QM, as shown as the narrower high-level pulse of the output signal $S_{TRI}$, causing the Q output of the RS flip-flop to enter the low level state whenever the high level of the control signal PWM ends, which is the falling edge of the control signal PWM, and this low level state of the Q output of the RS flip-flop continues during the entire off-period $T_{OFF}$, forcing the switch SW5 to turn off and thus the output voltage $V_{TRS}$ from the third voltage follower 128 passing through the output stage 205 and is sent out to node 126 in the off-period $T_{OFF}$. Under both CCM and DCM, in any cycle when the main switch QM is turned on by the high level control signal and enters the on-period $T_{ON}$ stage, the drain voltage of the main switch QM is low. When the fourth voltage follower 115 detects the secondary output voltage converted from the initial voltage at node 104, the voltage at node 104 will drop and also causes the secondary output voltage of the fourth voltage follower 115 to drop. Due to the phase shift effect or delay effect between resistor R13 and capacitor $C_4$, at this stage the low drain voltage of the main switch QM will cause the voltage of capacitor $C_4$ at node 127 to be higher than the sum of the reference voltage $V_{TH}$ and the secondary output voltage of the fourth voltage follower 115, hence the set terminal S of RS flip-flop 120 receives the high level comparison result $S_{COM}$ from the comparator 116 and generates a high level output signal at output terminal Q forcing the switch SW5 to turn on conducting the output voltage $V_{TRS}$ of the third voltage follower 128 to the ground during the on-period $T_{ON}$. Under DCM, when the secondary current $I_S$ drops to zero, indicating the entering into the dwell time $T_D$ and causing the drain voltage of the main switch QM to drop, with the drain voltage at this period being much lower than that at the off-period $T_{OFF}$, and since a lower drain voltage output causes the output voltage of the fourth voltage follower 115 to drop simultaneously, at this moment due to the phase-shifting effects of resistor R13 and capacitor $C_4$, the voltage of the capacitor $C_4$ at node 127 is higher than the sum of the reference voltage $V_{TH}$ and output voltage from the fourth voltage follower 115, therefore set terminal S of the RS flip-flop 120 receives the high level comparison result $S_{COM}$ from the comparator 116 and transmits a high level output signal at the output terminal Q, forcing the switch SW5 to turn on conducting the output voltage $V_{TRS}$ of the third voltage follower 128 to the ground during the dwell time $T_D$.

According to this method in a cycle $T_S$, the output voltage $V_{TRS}$ can pass through the output stage 205 to the node 126 only within the off-period $T_{OFF}$, thus $V_F = R_{SUM} \times (I_{LEB} + I_{OFF}) \times (T_{OFF} \div T_S)$, and the output current $I_O = \{N \times (I_{LEB} + I_{OFF}) \times T_{OFF}\} \div (2 \times T_S)$, where $I_O$ is from the secondary side of transformer 130 to the load, thus $I_O = (N \times V_F) \div (2 \times R_{SUM})$, achieving the equations (5) and (10), where N is the ratio between the number of turns $N_P$ of the primary winding 130A and the number of turns $N_S$ of the secondary winding 130B.

As mentioned above, in some alternative embodiments, the output stage 205 also includes the resistor R15 connected between node 125 at one end of switch SW5 and the output terminal of the third voltage follower 128, a resistor R16 connected between node 125 and node 126, a capacitor $C_5$ connected between node 125 at one end of the resistor R16 and ground, and a capacitor $C_6$ connected between node 126 at the other end of resistor R16 and ground. The resistor R16 and capacitor $C_6$ forms a filtering circuit to ensure that the output voltage $V_F$ at node 126 is a smoothed voltage with a small ripple.

While the above is a complete description of the preferred embodiments of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

The invention claimed is:

1. An output current calculation circuit for a flyback converter comprises:
   a detection module detecting a primary current flowing through a sensing resistor connected in series with a primary winding, wherein at a moment a main switch controlling on or off of the primary winding is turned off by a control signal, the detection module detects an off current value $I_{OFF}$ flowing through the sensing resistor, and at a moment an active state of a leading-edge blanking signal used for shielding an initial spike of the primary current ends, the detection module detects a blanking current value $I_{LEB}$ flowing through the sensing resistor;
   a sample and hold latch storing information related to the off current value $I_{OFF}$ and the blanking current value $I_{LEB}$;
   a current summing unit summing the off current value $I_{OFF}$ and the blanking current value $I_{LEB}$;
   an output stage transmitting a voltage converted from a sum current of the off current value $I_{OFF}$ and the blanking current value $I_{LEB}$ according to a predetermined ratio in each cycle; and
   a logic control unit controlling the output stage only to transmit the voltage converted from the sum current within a predetermined time period in each switching cycle.

2. The output current calculation circuit for a flyback converter of claim 1, wherein the detection module comprises:
   a first voltage-current converter collecting a sensing voltage signal across the sensing resistor representing the primary current, and converting the sensing voltage signal into an intermediate current flowing through a conversion resistor connected between an output terminal of the first voltage-current converter and ground; wherein
   at the moment when the main switch is turned off, the detection module converts a voltage applied on the conversion resistor into a sensing voltage signal corresponding to the off current value $I_{OFF}$ and delivers to the sample and hold latch for storage; and
   at the moment when the active state of the leading-edge blanking signal ends, the detection module converts the voltage applied on the conversion resistor into a sensing voltage signal corresponding to the blanking current value $I_{LEB}$ and delivers to the sample and hold latch for storage.

3. The output current calculation circuit for a flyback converter of claim 2, wherein the detection module comprises:
   a first voltage follower having a positive input terminal connected to the output terminal of the first voltage-current converter;
   a first switch driven by the control signal connected between an output terminal of the first voltage follower and a first storage capacitor of the sample and hold latch, at the moment the control signal turning off the main switch, the first switch is turned off synchronously, the voltage on the conversion resistor generated by the intermediate current is converted by the first voltage follower into the sensing voltage signal corresponding to the off current value $I_{OFF}$ and stored in the first storage capacitor.

4. The output current calculation circuit for a flyback converter of claim 2, wherein the detection module comprises:
a second voltage follower having a positive input terminal connected to the output terminal of the first voltage-current converter;
a second switch driven by the leading-edge blanking signal connected between an output terminal of the second voltage follower and a second storage capacitor of the sample and hold latch, at the moment the active state of the leading-edge blanking signal ends, the second switch is turned off synchronously, and the voltage on the conversion resistor generated by the intermediate current is converted by the second voltage follower into the sensing voltage signal corresponding to the blanking current $I_{LEB}$ and stored in the second storage capacitor.

5. The output current calculation circuit for a flyback converter of claim 1, wherein the current summing unit comprises:
a second voltage-current converter that restores the sensing voltage signal corresponding to the off current value $I_{OFF}$ stored in the sample and hold latch to a current equal to the off current value $I_{OFF}$ flowing through an output terminal of the second voltage-current converter;
a third voltage-current converter that restores and converts the sensing voltage signal corresponding to the blanking current value $I_{LEB}$ and stored in the sample and hold latch into a current equal to the blanking current value $I_{LEB}$ flowing through an output terminal of the third voltage-current converter; and
a third voltage follower; wherein output currents from the second and the third voltage-current converters are connected to a common node and flow through a summing resistor between the common node and ground, and the third voltage follower has a positive input terminal connected to the common node, and an output terminal delivering voltage $V_{TRS}$ equals to $(I_{LEB}+I_{OFF})$ multiplying by resistance value $R_{SUM}$ of the summing resistor.

6. The output current calculation circuit for a flyback converter of claim 5, wherein the output stage comprises a third switch having an input terminal receiving the voltage $V_{TRS}$ generated by the sum current and an output terminal grounded;
wherein the third switch is turned off during predetermined main switch off period $T_{OFF}$ in each switching cycle, such that the output stage outputs the voltage $V_{TRS}$, and the third switch is turned on during the remaining period of each switching cycle in order to release the voltage $V_{TRS}$ to ground to prevent the output stage from transmitting the voltage $V_{TRS}$.

7. The output current calculation circuit for a flyback converter of claim 6, wherein when the flyback converter operates under Continuous Current Mode (CCM), during the main switch off period $T_{OFF}$ the third switch is turned off and the voltage $V_{TRS}$ is transmitted to the output terminal of the output stage, while during the main switch on period $T_{ON}$ the third switch is turned on to prevent the output stage from transmitting voltage $V_{TRS}$, and the output voltage $V_F$ from output stage satisfies the following equation:

$$V_F = V_{TRS} \times \frac{T_{OFF}}{T_{ON} + T_{OFF}}$$

8. The output current calculation circuit for a flyback converter of claim 7, wherein a ratio between number of windings $N_P$ for primary windings and number of windings $N_S$ for secondary windings is n, an output current $I_O$ delivered from the flyback converter to the load satisfies the following equation:

$$I_O = n \times \frac{1}{2} \times \frac{V_F}{R_{SUM}}$$

9. The output current calculation circuit for a flyback converter of claim 6, wherein when the flyback converter operates under Discontinuous Current Mode (DCM), during the main switch off period $T_{OFF}$ the third switch is turned off and the voltage $V_{TRS}$ is transmitted to the output terminal of the output stage, while during the main switch on period $T_{ON}$ and dwell time $T_D$ the third switch is turned on to prevent the output stage from transmitting voltage $V_{TRS}$, and the output voltage $V_F$ from output stage satisfies the following equation:

$$V_F = V_{TRS} \times \frac{T_{OFF}}{T_{ON} + T_{OFF} + T_D}$$

10. The output current calculation circuit for a flyback converter of claim 9, wherein a ratio between number of windings $N_P$ for primary windings and number of windings $N_S$ for secondary windings is n, an output current $I_O$ delivered from flyback converter to the load satisfies the following equation:

$$I_O = n \times \frac{1}{2} \times \frac{V_F}{R_{SUM}}$$

11. The output current calculation circuit used for flyback converter of claim 6, wherein the output stage comprises:
a sample and hold circuit including a resistor connected between an input end of the third switch and the output terminal of the third voltage follower and a capacitor connected between the input end of the third switch and ground; a filtering circuit including another resistor connected between the input end of the third switch and an output terminal of the output stage and a capacitor connected between the output terminal of the output stage and ground.

12. The output current calculation circuit for a flyback converter of claim 6, wherein the logic control unit comprises:
a fourth voltage follower having a positive input terminal connected to a drain terminal of the main switch;
a capacitor having one end connected to ground;
a resistor connected between an ungrounded end of the capacitor and an output terminal of the fourth voltage follower;

a comparator having a non-inverting input terminal connected to the ungrounded end of the capacitor;
a voltage source having a positive electrode connected to an inverting input terminal of the comparator for providing a reference voltage, and a negative electrode connected to the output terminal of the fourth voltage follower; and
a RS flip-flop having a set terminal connected to the output terminal of the comparator; wherein
a high level comparison result from the comparator sets an output of the RS flip-flop to a high level, and a high level pulse triggered by a falling edge of the control signal resets the output of the RS flip-flop to a low level state, and the output of the RS flip-flop controls the on and off of the third switch.

13. The output current calculation circuit for a flyback converter of claim 12, wherein, under the CCM mode, during the main switch on-period $T_{ON}$ the RS flip-flop transmits a high level output to a control terminal of the third switch and turns it on; and
during the main switch off-period $T_{OFF}$ the RS flip-flop transmits a low level output to the control terminal of the third switch and turns it off; wherein
the output stage during each cycle generates an output voltage of the voltage $V_{TRS}$ multiplying a predetermined ratio of $\{T_{OFF} \div (T_{ON}+T_{OFF})\}$.

14. The output current calculation circuit for a flyback converter of claim 12, wherein, under the DCM mode, during the main switch on-period $T_{ON}$ and dead time $T_D$ the RS flip-flop transmits a high level output to a control terminal of the third switch and turns it on; and
during the main switch off period $T_{OFF}$ the RS flip-flop transmits a low level output to the control terminal of the third switch and turns it off; wherein
the output stage during each cycle generates an output voltage of the voltage $V_{TRS}$ multiplying a predetermined ratio of $\{T_{OFF} \div (T_{ON}+T_{OFF}+T_D)\}$.

15. The output current calculation circuit for a flyback converter of claim 12, wherein, the logic control unit further comprise an AND gate having an output terminal connected to a reset terminal of the RS flip-flop and an inverter connected between two input terminals of the AND gate forming a monostable multivibrator; wherein
an inverted signal after the control signal passes through and inverted by another inverter is transmitted to one input terminal of the AND gate and the input terminal of the inverter connected between the two input terminals of the AND gate, thus at the falling edge of the control signal the AND gate is triggered to generate an output signal of high level pulse to clamp the output of the RS flip-flop to the low level.

16. The output current calculation circuit for a flyback converter of claim 1, wherein, during each cycle, a time period between a moment the main switch is turned on and the moment the active state of the leading-edge blanking signal ends is set equal to a delay time between a moment the control signal changes from logic high level to logic low level when the main switch is about to be turned off and a moment the primary current rises to a maximum peak current.

17. A method for calculating output current of a flyback converter comprises the following steps:
detecting a primary current flowing through a sensing resistor connected in series with a primary winding using a detection module, wherein at a moment a main switch used for controlling on or off of the primary winding is turned off by a control signal, an off current value $I_{OFF}$ flowing through the sensing resistor is detected, and at a moment an active state of a leading-edge blanking signal used for shielding an initial spike pulse of the primary current ends, a blanking current value $I_{LEB}$ flowing through the sensing resistor is detected;
storing the off current value $I_{OFF}$ data and the blanking current value $I_{LEB}$ data in a sample and hold latch;
summing the off current value $I_{OFF}$ and the blanking current value $I_{LEB}$ using a current summing unit;
outputting a voltage converted from a sum value of the off current value $I_{OFF}$ and the blanking current value $I_{LEB}$ through an output stage in a predetermined time period of each cycle, wherein the predetermined time period of each cycle being controlled by a logic control unit.

18. The method of claim 17, wherein the detection module comprises a first voltage-current converter to detect and capture a voltage sensing signal across the sensing resistor representing the primary current and converts the voltage sensing signal to an intermediate current flowing through a conversion resistor connected between an output terminal of the first voltage-current converter and ground;
at the moment the main switch is turned off, the detection module converts the voltage applied on the conversion resistor into a voltage sensing signal corresponding to the off current value $I_{OFF}$ and delivers to the sample and hold latch for storage; and
at the moment when the active state of the leading-edge blanking signal ends, the detection module converts the voltage applied on the conversion resistor into a voltage sensing signal corresponding to the blanking current value $I_{LEB}$ and delivers to the sample and hold latch for storage.

19. The method of claim 18, wherein the detection module comprises a first voltage follower having a positive input terminal connected to the output terminal of the first voltage-current converter; and a first switch driven by a control signal connected between the output terminal of the first voltage follower and an ungrounded end of a first storage capacitor of the sample and hold latch; wherein at a moment the control signal changes from a first state to a second state turning off the main switch, the first switch is turned off synchronously and the voltage produced on the conversion resistor by the intermediate current is converted by the first voltage follower into a voltage sensing signal corresponding to the off current value $I_{OFF}$ stored in the first storage capacitor.

20. The method of claim 18, wherein the detection module comprises a second voltage follower having a positive input terminal connected to the output terminal of the first voltage-current converter and a second switch driven by the leading-edge blanking signal connected between an output terminal of the second voltage follower and an ungrounded end of a second storage capacitor of the sample and hold latch; at a moment the leading-edge blanking signal changes from the first states to the second state, the second switch is turned off and the voltage produced on the conversion resistor by the intermediate current is converted by the second voltage follower into a voltage sensing signal corresponding to the blanking current $I_{LEB}$ and stored in the second storage capacitor.

* * * * *